United States Patent [19]

Tuijn

[11] Patent Number: 5,841,823
[45] Date of Patent: *Nov. 24, 1998

[54] METHOD AND APPARATUS FOR EXTRACTING A CLOCK SIGNAL FROM A RECEIVED SIGNAL

[75] Inventor: Roland Van Der Tuijn, Mougins, France

[73] Assignee: VLSI Technology, Inc., San Jose, Calif.

[*] Notice: The term of this patent shall not extend beyond the expiration date of Pat. No. 5,598,446.

[21] Appl. No.: 542,870

[22] Filed: Oct. 13, 1995

[51] Int. Cl.⁶ .................................................... H03D 3/24
[52] U.S. Cl. ......................... 375/373; 375/360; 327/160
[58] Field of Search .................................... 375/354, 360, 375/364, 373, 371; 370/503; 327/141, 160

[56] References Cited

U.S. PATENT DOCUMENTS

| | | | |
|---|---|---|---|
| 4,847,874 | 7/1989 | Kroeger et al. | 375/360 |
| 4,984,255 | 1/1991 | Davis et al. | 375/360 |
| 5,519,737 | 5/1996 | Brun et al. | 375/376 |
| 5,598,446 | 1/1997 | Van Der Tuijn | 375/360 |

OTHER PUBLICATIONS

European Telecommunication Standard (ETS) 300 175–2, European Telecommunications Standards Institute (ETSI), Reference DE/RES–3001–2, Oct. 1992, pp. 7,9,15,16,22 and 23.

European Telecommunication Standard (ETS) 300 175–3, European Telecommunications Standards Institute (ETSI), Reference DE/RES–3001–3, Oct. 1992, pp. 13,15,24,25, 187,188.

*Primary Examiner*—Temesghen Ghebretinsae
*Attorney, Agent, or Firm*—Douglas L. Weller

[57] ABSTRACT

A clock signal is extracted from a received signal. An edge detector detects edges of the received signal, where the received signal transitions between a logic 0 and a logic 1. A center between each pair of consecutive edges is determined. Each center which is not within an associated correction window is discarded. An extracted clock signal is generated. The phase of the extracted clock signal is varied based on the centers between each pair of consecutive edges which are not discarded. In one embodiment, a current correction window size is varied based on whether an immediate previous center was within an immediate previous correction window. When the immediate previous center is discarded because it is not within the immediate previous correction window, the current correction window size is enlarged. When the immediate previous center is within the immediate previous correction window, and the immediate previous correction window is not already at a predetermined minimum size for correction windows, the current correction window size is reduced.

14 Claims, 5 Drawing Sheets

FIGURE 4

METHOD AND APPARATUS FOR EXTRACTING A CLOCK SIGNAL FROM A RECEIVED SIGNAL

BACKGROUND

The present invention concerns the field of digital communication and pertains particularly to filtering an extracted clock using a correction window to filter calculated center bits.

A cordless telephone system generally includes a fixed part, which connects a telephone network to one or more base stations. Base stations are generally connected to a fixed part by wires, or may be integrated directly with the fixed part. The base station communicates with one or more portable parts, typically a handset, via a radio frequency (RF) signal link. For example, the RF signal link may utilize a time division multiple access-time division duplex (TDMA-TDD) signaling system as set out in European Telecommunication Standard (ETS) 300 175-2, European Telecommunications Standards Institute (ETSI), Reference DE/RES-3001-2, October 1992.

A transmission clock signal is included in the RF signals transmitted between the base station and the fixed part. Various circuitry may be used to extract the clock signal. However this task is complicated by RF signal degradation caused, for example, by interference, noise, fading, etc. It is desirable, therefore, to develop circuitry which efficiently and effectively extracts the correct clock signal from a potentially degraded RF signal.

SUMMARY OF THE INVENTION

In accordance with the preferred embodiment of the present invention, a clock signal is extracted from a received signal. An edge detector detects edges of the received signal, where the received signal transitions between a logic 0 and a logic 1. A center between each pair of consecutive edges is determined. Each center which is not within an associated correction window is discarded. An extracted clock signal is generated. The phase of the extracted clock signal is varied based on the centers between each pair of consecutive edges which are not discarded.

In the preferred embodiment, a current correction window size is varied based on whether an immediate previous center was within an immediate previous correction window. When the immediate previous center is discarded because it is not within the immediate previous correction window, the current correction window size is enlarged. When the immediate previous center is within the immediate previous correction window, and the immediate previous correction window is not already at a predetermined minimum size for correction windows, the current correction window size is reduced.

Also, in the preferred embodiment, the center between each pair of consecutive edges is determined by counting a number of cycles of an over sampling signal which occurs between each pair of consecutive edges to obtain a bit width. The bit width is divided in half and the result added to an edge phase value to obtain a value for the center.

Additionally, the phase of the extracted clock signal is varied based on the center between each pair of consecutive edges as follows. An amount a plurality of centers varies from a center of the extracted clock signal is averaged to produce a phase error. In the preferred embodiment current center and an immediately previous center are used to produce the phase error. The phase of the extracted clock signal is changed an amount equal to the phase error.

The present invention reduces clock phase jitter while allowing for fast and efficient correction of phase in an extracted clock.

BRIEF DESCRIPTION OF THE DRAWINGS

FIG. 4 is a diagram illustrating clock extraction performed by the clock recovery circuitry shown in FIG. 3, in accordance with the preferred embodiment of the present invention.

DESCRIPTION OF THE PREFERRED EMBODIMENT

Figure 1:
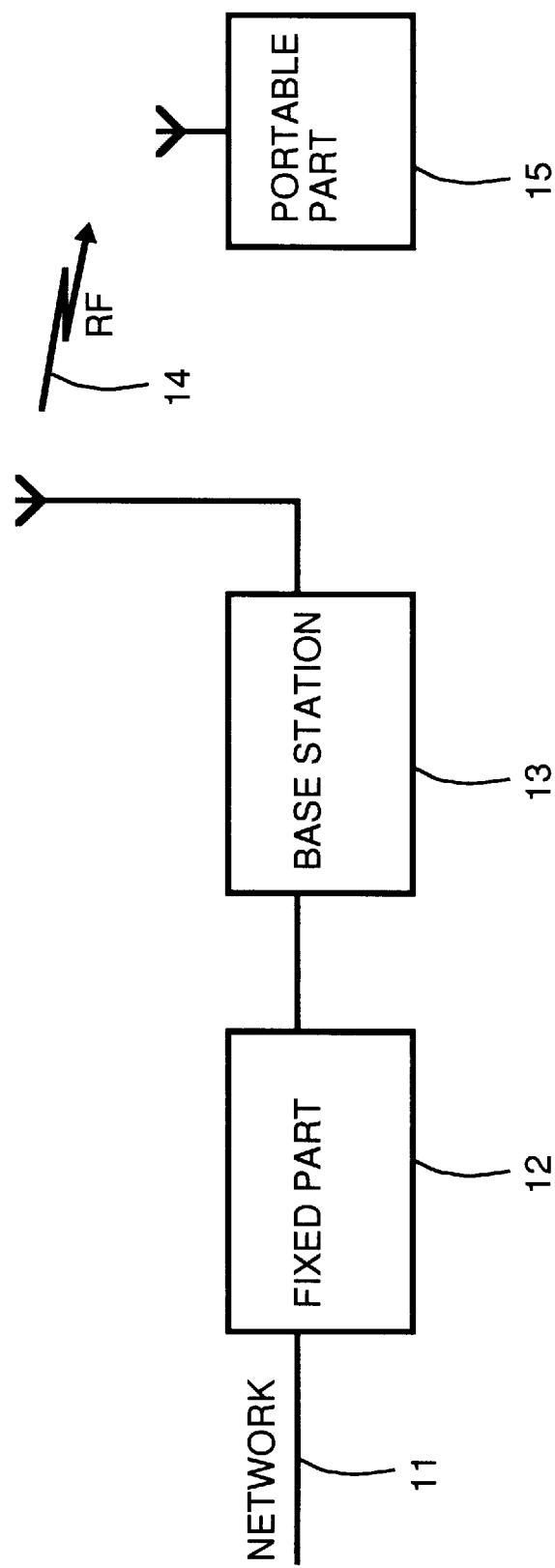
FIG. 1 is a block diagram of a cordless telephone system.

FIG. 1 shows a cordless telephone system. A fixed part 12 connects a telephone network 11 to a base station 13. Base station 13 is connected to fixed part 12 by wire, or may be integrated directly with fixed part 12. Base station 13 communicates with a portable part 15, for example a handset, via a radio frequency (RF) signal link 14. For example, RF signal link 14 may utilize a time division multiple access-time division duplex (TDMA-TDD) signaling system as set out in European Telecommunication Standard (ETS) 300 175-2.

Figure 2:
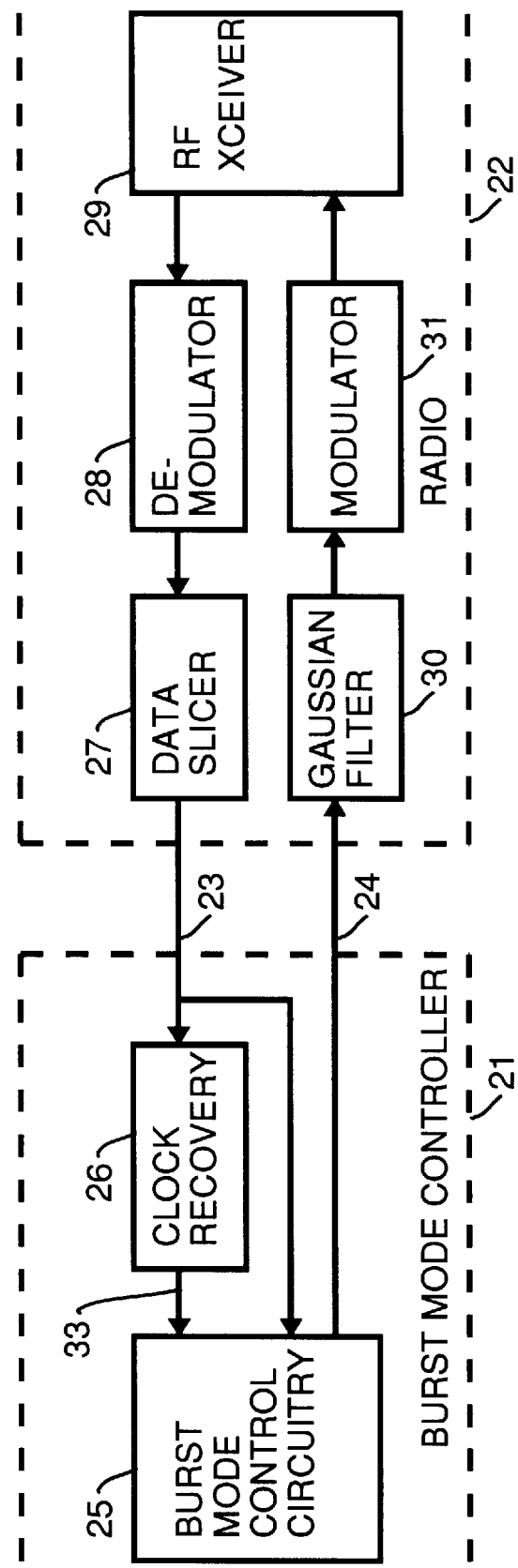
FIG. 2 is a block diagram of a burst mode controller and radio within parts of the cordless telephone system shown in FIG. 1, in accordance with a preferred embodiment of the present invention.

Base station 13 and portable part 15 each contain a radio and a burst mode controller. This is illustrated by FIG. 2. As shown in FIG. 2, a radio 22 includes a radio frequency transceiver 29, a modulator 31, a gaussian filter 30, a de-modulator 28 and a data slicer 27. A burst mode controller 21 includes burst mode control circuitry 25 and clock recovery circuitry 26.

Burst mode controller 21 includes burst mode control circuitry 25 and clock recovery circuitry 26. Transmit data 24 is transmitted from burst mode control circuitry 25 in burst mode controller 21 to gaussian filter 30 in radio 22. After being filtered by gaussian filter 30, the transmit data is modulated by modulator 31 and subsequently transmitted by radio frequency transceiver 29.

Within radio 22, radio frequency transceiver 29 receives a radio frequency signal from an antenna. The radio frequency signal is de-modulated by de-modulator 28 and is then processed by data slicer 27 to create a receive data digital signal 23 consisting of logic ones and logic zeros. Clock recovery circuitry 26 extracts an extracted (recovered) clock 33 from receive data digital signal 23. Receive data digital signal 23 may be degraded, for example, by interference, noise, fading, etc. As a result, often receive data digital signal 23 is not an ideal 50% mark-pace ratio signal. This complicates the task of extracting extracted clock 33 from receive data digital signal 23.

Clock recovery circuitry 26 detects edge information upon the occurrence of particular three cycle over sampling patterns. A logic 0 to logic 1 transition is detected when a three cycle "0,1,1" over sampling pattern occurs. A logic 1 to logic 0 transition is detected when a three cycle "1,0,0"

over sampling pattern occurs. Extracted clock 33 is a 50% mark-pace ratio signal with the frequency determined by edges detected from receive data digital signal 23.

Figure 3:
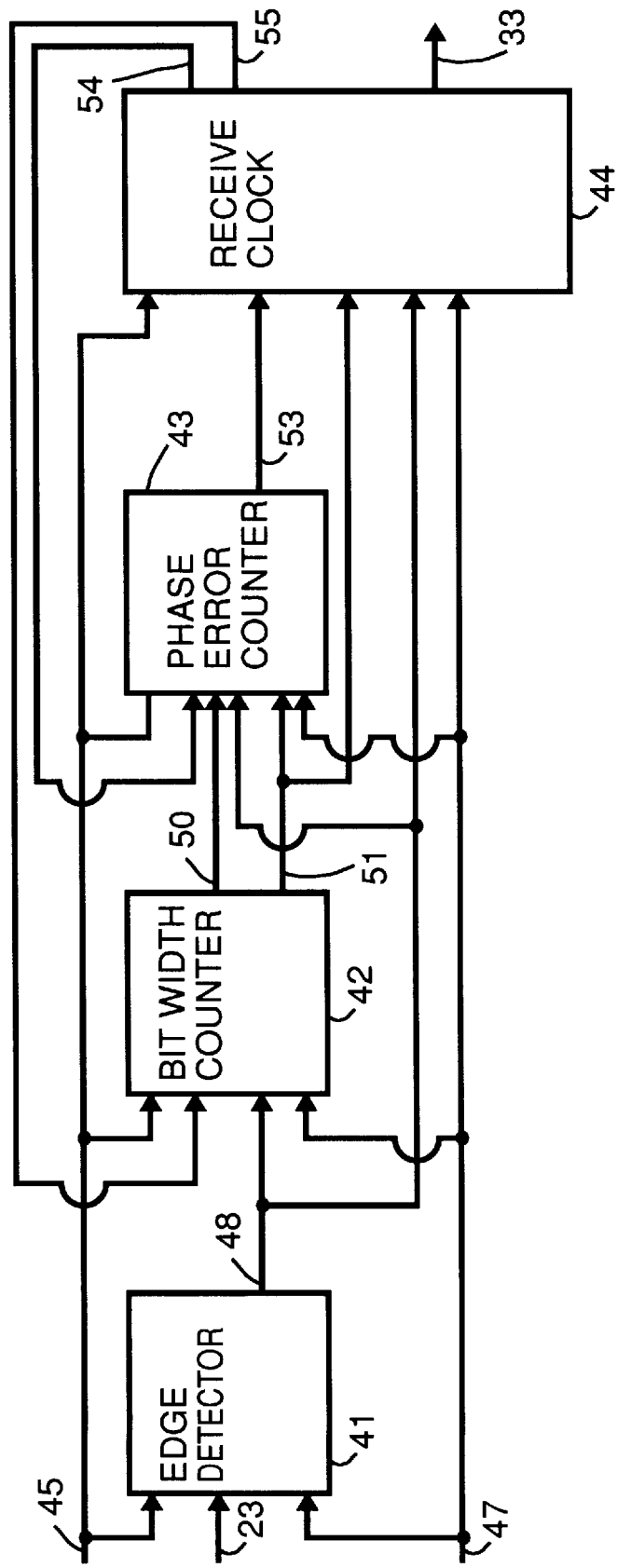
FIG. 3 is a block diagram of clock recovery circuitry within the burst mode controller shown in FIG. 2, in accordance with a preferred embodiment of the present invention.

FIG. 3 shows a block diagram of clock recovery circuitry 26. Clock recovery circuitry 26 includes an edge detector 41, a bit width counter 42, a phase error counter 43 and receive clock generation block 44. A search enable signal 45 is utilized to enable and disable logic blocks within clock recover circuitry 26. A sampling clock signal 47 is used to time sampling of receive data digital signal 23. For example, sampling clock signal 47 operates at 18.43 MHz resulting in 16 times over sampling of receive data digital signal 23. Alternately, sampling clock signal 47 operates at 13.824 MHz resulting in 12 times over sampling of receive data digital signal 23. Sampling clock signal 47 is used to detect transitions in receive data digital signal 23 using the three cycle patterns described above. Each handset and base station have their own system clock.

Edge detector 41 generates an edge signal 48. Edge signal 48 is asserted when an edge transition is detected. Edge detector 41 detects both rising and falling edges of receive data digital signal 23.

Bit width counter 42 counts cycles of sampling clock signal 47 between receipt of asserted edge signal 48 (bit width) in order to generate a five bit center signal 50. Center signal 50 indicates the center position relative to the previous edge received from receive data digital signal 23. Center signal 50 is adjusted to take into account a four bit edge phase relation signal 55 received from clock generation block 44. Five bit center signal 50 (center) may thus be calculated using Formula 1 below:

FORMULA 1 center=edge phase relation+(bit width DIV 2)

In Formula 1 above, "DIV" represents a division where the fractional part of the result is discarded so that the end result is an integer. Bit width counter 42 also generates a bit error signal 51. Bit error signal 51 from bit width counter 42 distinguishes between single and multiple received bits. If two consecutive logic is are received there is no edge detected indication between these bits and the bit center signal 50 will indicate the center of two bits. This center is in fact the end of the first bit and the start of the second bit. Bit error signal 51 is used to signal that not one but two consecutive bits are received. Bit error signal 51 is asserted if the bit width exceed one and three-quarters of a 50% mark space ratio bit (at 12 times over-sampling this would be 21).

Phase error counter 43, calculates a five-bit phase error signal 53 (phase error) using five bit center signal 50 (new bit center) and the previous normalized center position (previous center) using Formula 2 set out below:

FORMULA 2 phase error=(previous center+new bit center) DIV 2

Receive clock generation block 44 generates extracted clock 33 from a cyclic receive clock counter, which counts up to the number of over sampling—as discussed above, in the preferred embodiment this is 12 or 16. To do so, phase error signal 53 is added/subtracted from the receive clock counter whenever an edge is detected as indicated by edge signal 48. Only at receive clock counter value "0000" receive clock signal 33 is asserted for one system clock period. To be able to calculate the center in bit width counter, edge phase 55 is latched from cyclic receive clock counter every time edge signal 48 is asserted.

When generating extracted clock 33, clock generation block 44 uses a moment sample value of receive data digital signal 23 at the center position of each half cycle of extracted clock 33.

In addition, receive clock generation block 44 generates four-bit edge phase relation signal 55 and an out-of-window signal 54. Edge phase relation signal 55 indicates an edge location to be used by bit width counter 42 to calculate a value for center signal 50. Out-of-window signal 54 is asserted when a phase error is outside a correction window, i.e., when phase error signal 53 indicates a larger correction than is allowed by a correction window. This directs phase error counter 43 to disregard the new bit center and not update the previous center position. The information from this bit is discarded and is not taken into account for averaging.

Figure 4:
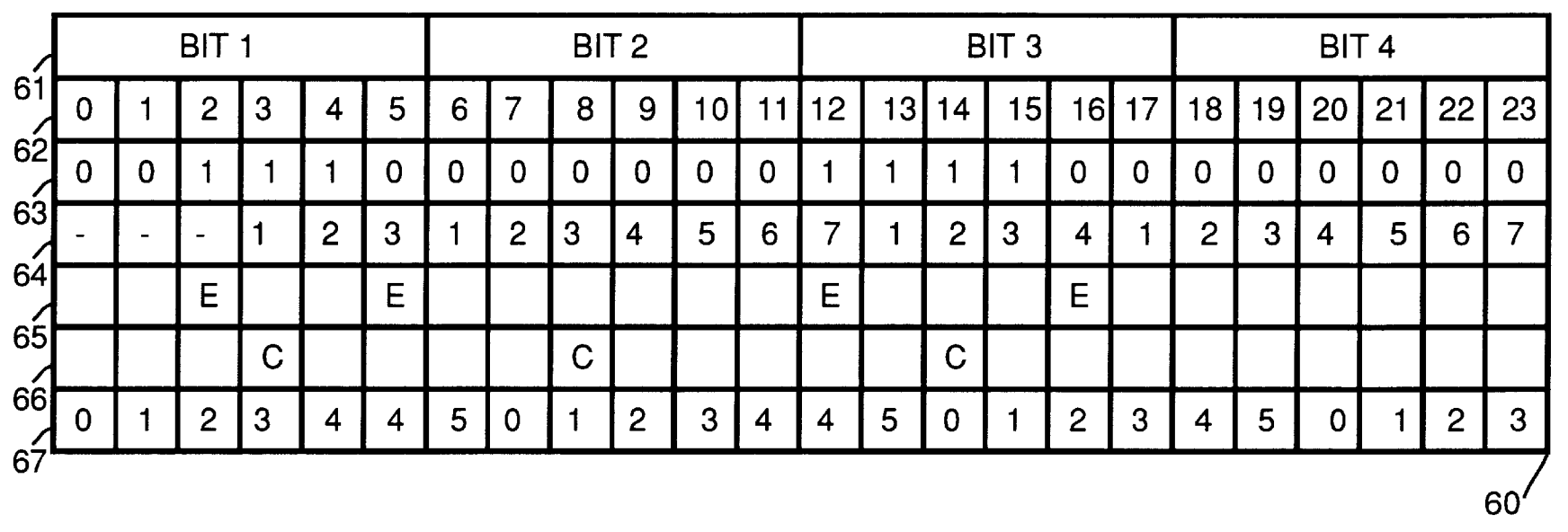

Operation of clock recovery circuitry 26 is illustrated by diagram 60 shown in FIG. 4. A row 61 shows nominal bit positions. A nominal bit position is the position of logic 0 and logic 1 bits with an ideal 50% mark space. This is shown only for reference to be able to see the ideal center position. A row 62 shows a sampling count, which is used for calibration in the following discussion. For the example illustrated by diagram 60, six times over sampling is used. This is done to limit the size of the diagram. In operation, it would be more typical to use, for example, 12 or 16 times over sampling. The amount of over sampling is controlled by the frequency of sampling clock signal 47.

A row 63 shows sampled values from receive data digital signal 23. Each sampled value is either a logic zero ("0") or a logic one ("1"). For example, when sampled at sampling count "0" (as shown in row 62), receive data digital signal 23 has a sampled value of "0" (as shown in row 63). When sampled at sampling count "1", receive data digital signal 23 has a sampled value of "0". When sampled at sampling count "2", receive data digital signal 23 has a sampled value of "1". And so on.

Row 65 shows edges detected by edge detector 41. At sampling count 2, edge detector 41 detects a transition of receive data signal 23 from logic 0 to logic 1. Therefore, in row 65 an "E" is placed at a location corresponding to sampling count 2. At sampling count 5, edge detector 41 detects a transition of receive data digital signal 23 from logic 1 to logic 0. Therefore, in row 65 an "E" is placed at a location corresponding to sampling count 5. At sampling count 12, edge detector 41 detects a transition of receive data signal 23 from logic 0 to logic 1. Therefore, in row 65 an "E" is placed at a location corresponding to sampling count 12. At sampling count 16, edge detector 41 detects a transition of receive data signal 23 from logic 1 to logic 0. Therefore, in row 65 an "E" is placed at a location corresponding to sampling count 16.

Row 64 shows a bit width count for bit width counter 42. Upon detection of the edge at sampling count 2, bit width counter 42 starts a new bit width count. Upon detection of the edge at sampling count 5, bit width counter 42 starts another new bit width count. Upon detection of the edge at sampling count 12, bit width counter 42 starts another new bit width count. Upon detection of the edge at sampling count 16, bit width counter 42 starts another new bit width count.

Row 66 shows the centers as calculated by bit width counter 42. Each center is represented by a "C".

Row 67 shows the extracted clock count. The extracted clock count is the count used by receive clock generation block 44. For a system where there is six times over sampling, the extracted clock count counts continuously from zero to five. The frequency of the extracted clock 33 is the same as the bit rate at receive data digital signal 23. Clock recovery circuitry 26 will synchronize extracted clock 33 to the receive data digital system 23.

When generating extracted clock 33, the extracted (recovered) clock count is continuously corrected to place each "0" of the extracted clock count at the center position of each half cycle of receive data digital signal 23. When extracting data from data digital signal 23, a moment sample value of receive data digital signal 23 is taken at each "0" of the extracted clock count.

In the example illustrated by diagram 60, bit width counter 42 calculates the center between the edge detected at sampling count 2 and the edge detected at sampling count 5 using Formula 1 above. In this case, the edge phase relation received from receive clock generation block 44 is 2. This is because the first edge shown in row 65 occurs at count "2" of the extracted clock count shown in row 67. The bit width is three. This is shown in row 64 where between the edge at sampling count 2 and the edge at sampling count 5, bit width counter 42 reaches a count of three. Inserting these values into Formula 1 above yields the following result:

center=edge phase relation+(bit width DIV 2)=2+(3 DIV 2)=3

On center signal 50, bit width counter 42 forwards the value three to phase error counter 43.

Phase error counter 43 calculates the phase error using Formula 2 above. Since this is the first calculated center, the previous center is assumed to occur at "0" of the extracted clock count, shown in row 67 (corresponding to "0" on the sampling count in row 62). The new bit center received from bit width counter 42 is three. Inserting these values into Formula 2 above yields the following result:

phase error=(previous center+new bit center) DIV 2=(0+3) DIV 2=1

The phase error is forwarded to receive clock generation block 44 as phase error signal 53. Receive clock generation block 44 updates the extracted clock count as shown in row 67 by repeating the fourth count. That is, the extracted clock count four is repeated at the position corresponding to sampling count 5. At sampling count 5, the extracted clock count is corrected with the phase error. Normally the extracted clock count would reach 5, but with a phase error correction of 1 the extracted clock count is set to 4. This results so that the extracted clock phase is shifted by 1. A phase error correction of 2 would have set the extracted clock count to 3, shifting the extracted clock count phase by 2. The phase error is also used to calculate a new value for the previous center. That is the previous center becomes the current bit center minus the phase error. This is illustrated by Formula 3 below:

FORMULA 3 previous center=new bit center−phase error=3−1=2

Since the second edge falls on count four of the extracted clock count (corresponding to "5" on the sampling count in row 62), receive clock generation block 44 forwards to bit width counter 42 the value "4" as edge phase relation signal 55. Bit width counter 42 calculates the center between the edge detected at sampling count 5 and the edge detected at sampling count 12 using Formula 1 above. In this case, the edge phase relation is 4, as indicated above. The bit width is seven, as shown in row 64 where it is seen that between the edge corresponding to sampling count 5 and the edge corresponding to sampling count 12, bit width counter 42 reaches a count of seven. Inserting these values into Formula 1 above yields the following result:

center=edge phase relation+(bit width DIV 2)=4+(7 DIV 2)=7

However, the extracted clock count has only six counts (0 to 5), so that a count of "7" is equivalent to an extracted clock count of "1" (7−6). Thus on center signal 50, bit width counter 42 forwards the value one to phase error counter 43.

Phase error counter 43 calculates the phase error using Formula 2 above. The previous center, calculated in Formula 3 above, has a value of 2. The present center received from bit width counter 42 is one. Inserting these values into Formula 2 above yields the following result:

phase error=(previous center+new bit center) DIV 2=(1+2) DIV 2=1

The phase error is forwarded to receive clock generation block 44 as phase error signal 53. Receive clock generation block 44 updates the extracted clock count as shown in row 67 by repeating the fourth count. That is the extracted clock count four is repeated at the position corresponding to sampling count 12.

The phase error is again used to calculate a new value for the previous center. That is the previous center becomes the current bit center minus the phase error. This is illustrated by substituting new values into Formula 3, as shown below:

previous center=new bit center−phase error=1−1=0

Since the third edge falls on count four of the extracted clock count (corresponding to "12" on the sampling count in row 62), receive clock generation block 44 forwards to bit width counter 42 the value "4" as edge phase relation signal 55. Bit width counter 42 calculates the center between the edge detected at sampling count 12 and the edge detected at sampling count 16 using Formula 1 above. In this case, the edge phase relation is 4, which was received by bit width counter 42 as edge phase relation signal 55. The bit width is four, as shown in row 64 where it is seen that between the edge corresponding to sampling count 12 and the edge corresponding to sampling count 16, bit width counter 42 reaches a count of four. Inserting these values into Formula 1 above yields the following result:

center=edge phase relation+(bit width DIV 2)=4+(4 DIV 2)=6

However, the extracted clock count has only six counts (0 to 5), so that a count of "6" is equivalent to an extracted clock count of "0" (6−6). Thus on center signal 50, bit width counter 42 forwards the value zero to phase error counter 43.

Phase error counter 43 calculates the phase error using Formula 2 above. The previous center, calculated in Formula 3 above, has a value of 0. The present center received from bit width counter 42 is zero. Inserting these values into Formula 2 above yields the following result:

phase error=(previous center+new bit center) DIV 2=(0+0) DIV 2=0

The phase error is forwarded to receive clock generation block 44 as phase error signal 53. Since the phase error is zero, receive clock generation block 44 makes no update to the extracted clock count as shown in row 67. Thus the extracted clock count is allowed to complete a circuit with no repeated counts. The phase error is again used to calculate a new value for the previous center. That is the previous center becomes the current bit center minus the phase error. This is illustrated by substituting new values into Formula 3, as shown below:

previous center=new bit center–phase error=0–0=0

And so on.

Receive clock generation block 44 utilizes out-of-window signal 54 to indicate when the phase error is outside the correction window and thus not to be used. In general, the width of the correction window controls the maximum clock phase correction allowed. The correction window initially starts out at a maximum value. For example, for 12 times over sampling, the correction window starts out at a value of 6. When the phase error sent from phase error counter 43 to receive clock generation block 44 is less than or equal to the correction window, the value of the correction window is decremented. This continues until the correction window is equal to its minimum value of 1. Once the correction window is equal to 1, it is no longer decremented.

When the phase error sent from phase error counter 43 to receive clock generation block 44 is greater than the correction window, clock generation block 44 ignores the phase error and increments the correction window. This protects against bit jitter.

For example, if the phase error sent from phase error count 43 to receive clock generation block 44 is equal to four and the correction window is equal to one, receive clock generation block 44 makes no update to the extracted clock count. Instead, receive clock generation block increments the correction error window and asserts out-of-window signal 54 indicating to phase error counter 43 that the last phase error was disregarded.

For example, when the RF signal link utilizes a time division multiple access-time division duplex (TDMA-TDD) signaling system as set out in European Telecommunication Standard (ETS) 300 175-2, with a system that over samples 12 times, at the beginning of every TDMA slot, the correction window starts out at a value of 6. As bits are received with the center position with the correction window, the correction window will be narrowed down until is equal to one.

Figure 5:
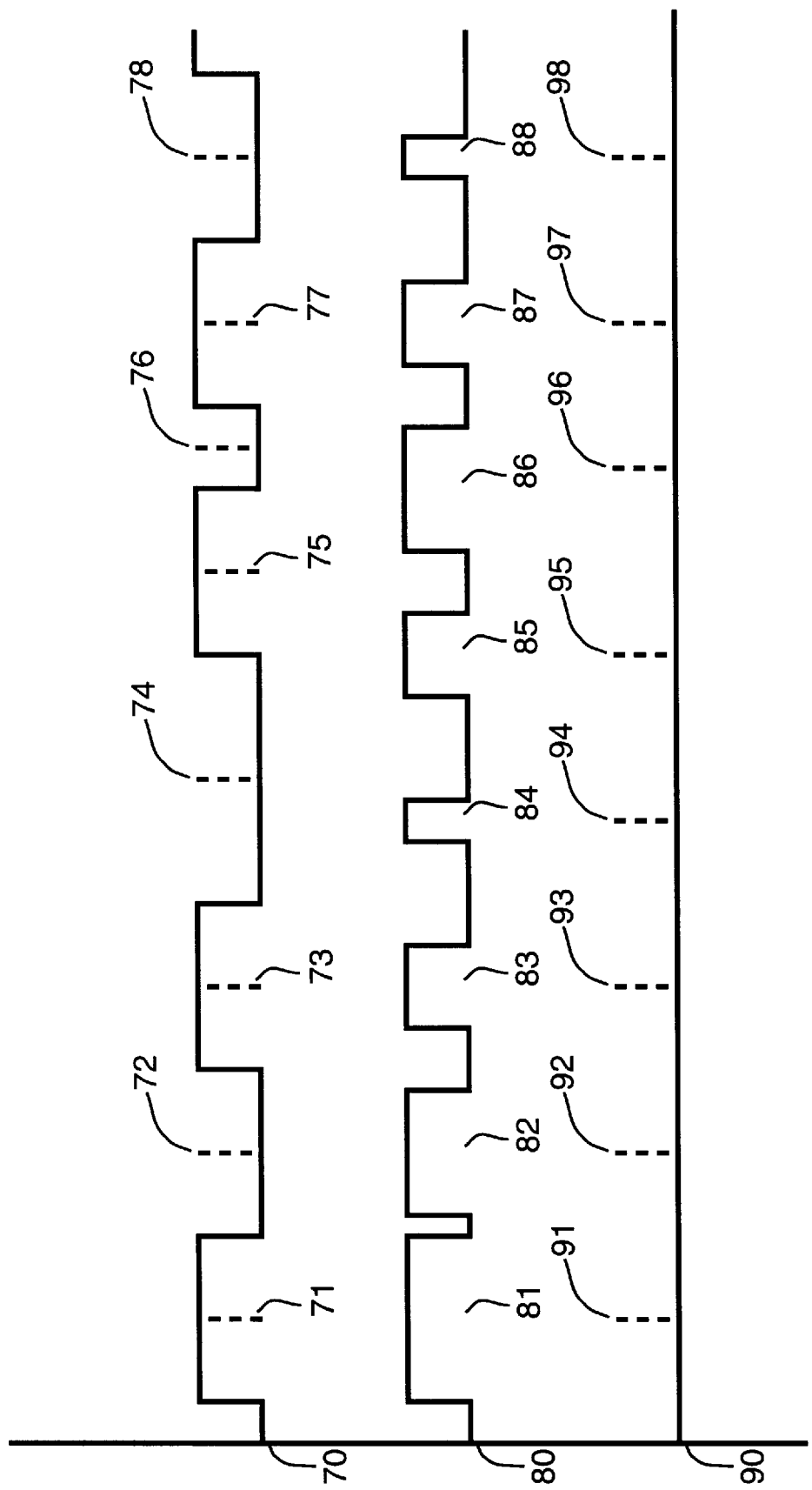
FIG. 5 is a timing diagram illustrating use of a correction window to filter a signal, in accordance with the preferred embodiment of the present invention.

FIG. 5 illustrates the use of a correction window. A received data signal 70 has bit centers 71, 72, 73, 74, 75, 76, 77 and 78. A correction window signal 80 has correction windows 81, 82, 83, 84, 85, 86, 87 and 88. A reconstructed clock center signal 90 has reconstructed clock centers 91, 92, 93, 94, 95, 96, 97 and 98.

Correction window 81 is initially open. Since bit center 71 is within correction window 81, correction window 82 is narrowed. Since bit center 72 is within correction window 82, correction window 83 is narrowed. Bit center 74 is outside correction window 84; therefore, bit center 74 is not used by reconstructed clock center signal 90 to generate reconstructed clock center 94 and correction window 85 is widened. Bit center 75 is outside correction window 85; therefore, bit center 75 is not used by reconstructed clock center signal 90 to generate reconstructed clock center 95 and correction window 86 is widened. Since bit center 76 is within correction window 86, correction window 87 is narrowed. Since bit center 77 is within correction window 87, correction window 88 is narrowed. The phase of reconstructed clock center The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for extracting a clock signal from a received signal, the method comprising the steps of:
    (a) detecting edges of the received signal where the received signal transitions between a logic 0 and a logic 1;
    (b) determining a center between each pair of consecutive edges detected in step (a);
    (c) discarding each center determined in step (b) which is not within an associated correction window; and,
    (d) generating the extracted clock signal, the phase of the extracted clock signal is varied on based on the centers determined in step (b) which are not discarded in step (c).

2. A method as in claim 1 additionally comprising the step of:
    (e) varying a current correction window size based on whether an immediate previous center was within an immediate previous correction window.

3. A method as in claim 2 wherein step (e) includes the following substeps:
    (e.1) when in step (c) the immediate previous center is discarded because it is not within the immediate previous correction window, enlarging the current correction window size; and,
    (e.1) when the immediate previous center is within the immediate previous correction window, and the immediate previous correction window is not already at a predetermined minimum size for correction windows, reducing the current correction window size.

4. A method as in claim 1 wherein step (a) is performed by an edge detector.

5. A method as in claim 1 wherein step (b) includes the following substeps:
    (b.1) counting a number of cycles of an over sampling signal which occurs between each pair of consecutive edges to obtain a bit width; and,
    (b.2) dividing the bit width in half and adding an edge phase value to obtain a value for the center.

6. A method as in claim 1 wherein step (d) includes the following substeps:
    (d.1) averaging an amount a plurality of centers determined in step (b) varies from a center of the extracted clock signal to produce a phase error; and,
    (d.2) changing the phase of the extracted clock signal an amount equal to the phase error produced in substep (d.1).

7. A method as in claim 6 wherein in substep (d.1), a current center and an immediately previous center are used to produce the phase error.

8. An apparatus for extracting a clock signal from a received signal, the apparatus comprising:
    edge detecting means for detecting edges of the received signal where the received signal transitions between a logic 0 and a logic 1;
    counter means, coupled to the edge detecting means, for determining a center between each pair of consecutive edges detected by the edge detecting means; and,
    clock generating means, coupled to the counter means, for generating an extracted clock signal, the clock generating beans varying the phase of the extracted clock signal based on the center between each pair of consecutive edges determined by the counter means, and the clock generating means discarding each center, determined by the counter means, which is not within an associated correction window.

9. An apparatus as in claim 8, wherein the clock generating means varies a current correction window size based on whether an immediate previous center was within an immediate previous correction window.

10. An apparatus as in claim 9, wherein the clock generating means includes:

means for enlarging the current correction window size when the immediate previous center is discarded because it is not within the immediate previous correction window; and, means for reducing the current correction window size when the immediate previous center is within the immediate previous correction window, and the immediate previous correction window is not already at a predetermined minimum size for correction windows.

11. An apparatus as in claim 8 wherein the edge detecting means is an edge detector which over samples the received signal to detect the edges.

12. An apparatus as in claim 8 wherein the counter means includes:

a counter which counts a number of cycles of an over sampling signal which occurs between each pair of consecutive edges to obtain a bit width; and, dividing means for dividing the bit width in half and adding an edge phase value to obtain a value for the center.

13. An apparatus as in claim 8 wherein the clock generating means includes:

a phase counter which, to produce a phase error, averages an amount a plurality of centers, determined by the counter means, varies from a center of the extracted clock signal; and, means for changing the phase of the extracted clock signal an amount equal to the phase error produced by the phase counter.

14. An apparatus as in claim 13 wherein the phase counter uses a current center and an immediately previous center to produce the phase error.

* * * * *